(12) United States Patent
Lu et al.

(10) Patent No.: US 8,569,083 B2
(45) Date of Patent: Oct. 29, 2013

(54) LIGHT-EMITTING DEVICE WITH NARROW DOMINANT WAVELENGTH DISTRIBUTION AND METHOD OF MAKING THE SAME

(75) Inventors: Chih-Chiang Lu, Hsinchu (TW); Shu-Ting Hsu, Hsinchu (TW); Yen-Wen Chen, Hsinchu (TW); Chien-Yuan Wang, Hsinchu (TW); Ru-Shi Liu, Hsinchu (TW); Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 282 days.

(21) Appl. No.: 12/711,678

(22) Filed: Feb. 24, 2010

(65) Prior Publication Data

US 2010/0213491 A1 Aug. 26, 2010
US 2013/0056772 A9 Mar. 7, 2013

Related U.S. Application Data

(63) Continuation-in-part of application No. 12/219,084, filed on Jul. 16, 2008, now Pat. No. 7,850,321.

(30) Foreign Application Priority Data

Feb. 25, 2009 (TW) ............................... 98106259 A
Apr. 24, 2009 (CN) .......................... 2009 1 0136885

(51) Int. Cl.
*H01L 21/00* (2006.01)

(52) U.S. Cl.
USPC ................... 438/28; 438/29; 438/31; 257/98; 257/E33.061; 257/E33.062; 257/E33.065

(58) Field of Classification Search
USPC .................................................... 257/E33.061
See application file for complete search history.

(56) References Cited

U.S. PATENT DOCUMENTS

| | | | |
|---|---|---|---|
| 2006/0076571 A1* | 4/2006 | Hsieh et al. ...................... 257/99 |
| 2008/0230765 A1* | 9/2008 | Yoon et al. ...................... 257/13 |
| 2009/0021926 A1* | 1/2009 | Wang et al. ..................... 362/84 |

* cited by examiner

*Primary Examiner* — Daniel Whalen
(74) *Attorney, Agent, or Firm* — Muncy, Geissler, Olds & Lowe, PLLC

(57) ABSTRACT

This application discloses a light-emitting device with narrow dominant wavelength distribution and a method of making the same. The light-emitting device with narrow dominant wavelength distribution at least includes a substrate, a plurality of light-emitting stacked layers on the substrate, and a plurality of wavelength transforming layers on the light-emitting stacked layers, wherein the light-emitting stacked layer emits a first light with a first dominant wavelength variation; the wavelength transforming layer absorbs the first light and converts the first light into the second light with a second dominant wavelength variation; and the first dominant wavelength variation is larger than the second dominant wavelength variation.

23 Claims, 9 Drawing Sheets

LIGHT-EMITTING DEVICE WITH NARROW DOMINANT WAVELENGTH DISTRIBUTION AND METHOD OF MAKING THE SAME

This application is a continuation-in-part of application Ser. No. 12/219,084, filed on Jul. 16, 2008 and issued as U.S. Pat. No. 7,850,321 on Dec. 14, 2010.

BACKGROUND

1. Technical Field

A wafer-scaled light-emitting device and manufacturing method thereof is disclosed, especially is related to a wafer-scaled light-emitting diode with narrow dominant wavelength distribution and a method of enabling convergent distribution of dominant wavelength of the wafer-scaled light-emitting device.

2. Reference to Related Application

This application claims the right of priority based on TW application Ser. No. 098106259, filed "Feb. 25, 2009", entitled "LIGHT-EMITTING DEVICE WITH NARROW DOMINANT WAVELENGTH DISTRIBUTION AND METHOD OF MAKING THE SAME" and the contents of which are incorporated herein by reference in its entirety.

3. Description of the Related Art

The light-generating mechanism of a light-emitting diode (LED) is that the difference of the energy of electrons moving between an n-type semiconductor and a p-type semiconductor is released through the form of light. This light-generating mechanism of the LED is different from that of incandescent lamps so the LED is titled a cold light source. Besides, LED has advantages like high reliability, long life span, small dimensions, and electricity saving so the LED has been deemed as an illumination source of a new generation.

FIG. 1A to FIG. 1E show a conventional process flow of manufacturing a light-emitting device. As FIG. 1A shows, a substrate 10 is provided. As FIG. 1B shows, a plurality of epitaxial stacked layers 12 is formed on the substrate 10, and the plurality of epitaxial stacked layers 12 is etched by lithography to form a plurality of light-emitting stacked layers 14, as FIG. 1C shows. Next, as FIG. 1D shows, electrodes 16 are formed on the plurality of light-emitting stacked layers 14 to form an LED wafer 100. Finally, as FIG. 1E shows, the LED wafer 100 is diced to form LED chips 18.

The distribution of the dominant wavelengths of the light-emitting stacked layers 14, however, is not uniform. The difference of the dominant wavelength can be 15 nm~20 nm or even more so the difference of the dominant wavelength of the LED chips 18 formed by the light-emitting stacked layers 14 is large as well. The problem of non-uniform distribution of the dominant wavelengths further influences the consistency of characteristics of the products utilizing the LED chips 18. Taking the conventional blue LED chip with the 460 nm dominant wavelength cooperating with the yellow phosphors to generate white light as an example, if the distribution range of the dominant wavelengths of the blue LED chips on the same LED wafer reaches 20 nm, namely the dominant wavelengths are between 450 nm and 470 nm, the distribution of the color temperatures of the white lights formed by mixing the light from the blue LED chips and the yellow wavelength-converting materials having 570 nm excited wavelength is also influenced.

As FIG. 2 shows, because the wide distribution of the dominant wavelengths of each light-emitting stacked layer on the LED wafer, the color temperatures of the white lights formed by mixing the light from the LED chips and the wavelength-converting materials distribute between 6500K and 9500K. With the difference of the color temperatures, which is about 3000K, the consistency of the quality of the products is affected significantly.

To solve the problem of non-uniform distribution of the dominant wavelength of the light-emitting stacked layers 14, there are probing, sorting, and binning processes in the conventional manufacturing process of the LED chips 18 to screen out the LED chips 18 having similar dominant wavelengths for various application demanding different wavelengths, as FIG. 3 shows.

Although the probing, sorting, and binning processes can reduce the influence upon the consistence of the quality caused by non-uniform distribution of the dominant wavelength, when the products to which the LED chips 18 are applied strictly require a tight distribution of the dominant wavelength, such as the back-light unit having the LED chips in the large size display, the ratio of the available LED chips 18 on the LED wafer 100 is low. Besides, sorting and binning processes are time-consuming and laborious, and increase the cost and time of manufacturing the LED chips.

SUMMARY

The present application provides an LED wafer with narrow dominant wavelength distribution including a substrate, a plurality of light-emitting stacked layers formed on the substrate, and a wavelength transforming layer formed on the plurality of light-emitting stacked layers to converge and convert the dominant wavelengths emitted from the light-emitting stacked layers.

The present application further discloses a method of converging the dominant wavelength distribution of the LED wafer, including the steps of providing a substrate, forming a plurality of light-emitting stacked layers on the substrate, and forming a wavelength transforming layer on the plurality of light-emitting stacked layers to converge the dominant wavelength distribution of each of the plurality of light-emitting stacked layers on the LED wafer.

The present application also provides a method of manufacturing a light-emitting device, including forming a wavelength transforming layer to converge the variation of the dominant wavelengths of the light-emitting stacked layers to improve the usage efficiency.

Another purpose of the present application is to provide a method of manufacturing a light-emitting device, including forming a wavelength transforming layer to converge the variation of the dominant wavelengths of the light-emitting stacked layers to eliminate sorting and binning processes in the manufacturing process of LED chips.

The foregoing aspects and many of the attendant purpose, technology, characteristic, and function of this application will become more readily appreciated as the same becomes better understood by reference to the following embodiments detailed description, when taken in conjunction with the accompanying drawings

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1A:
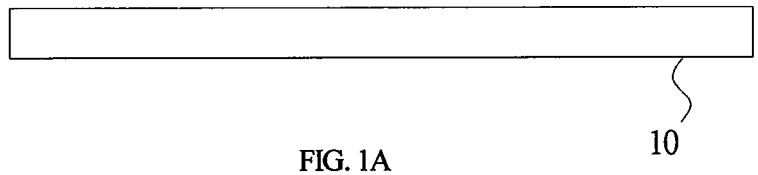
FIGS. 1A-1E illustrate a conventional process flow of manufacturing LED chips.
Figure 1B:
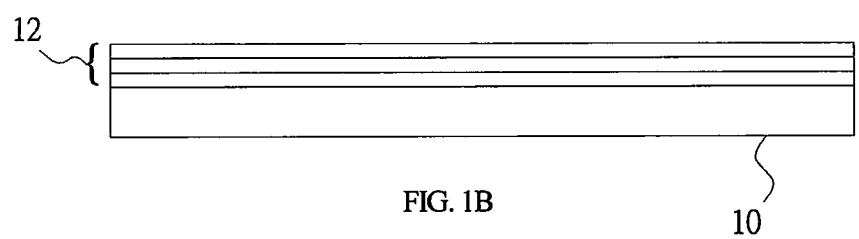
Figure 1C:
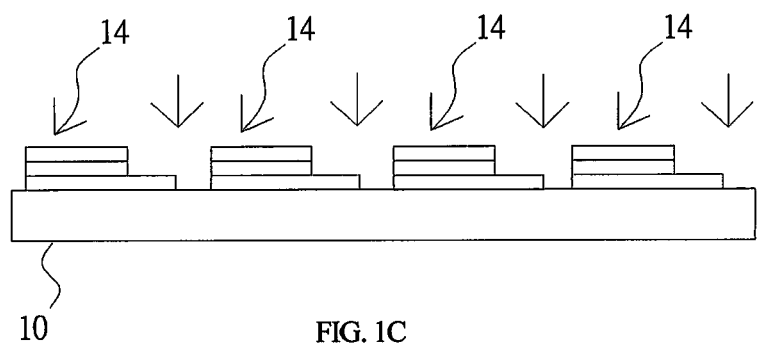
Figure 1D:
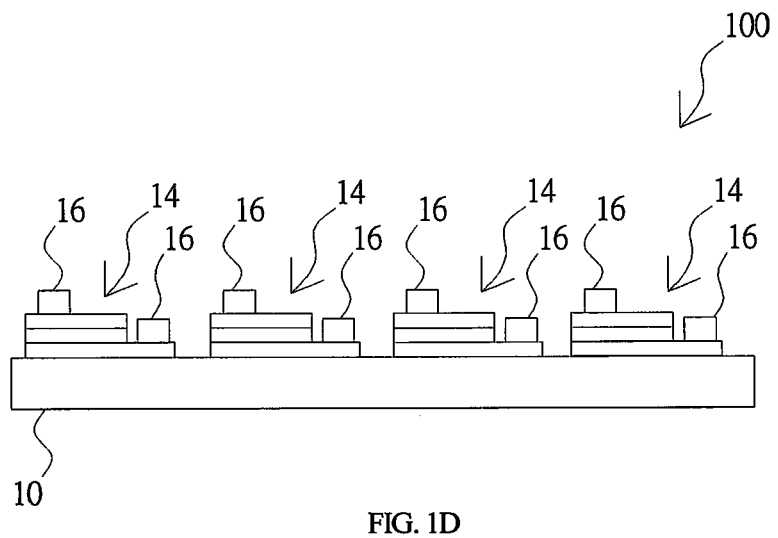
Figure 1E:
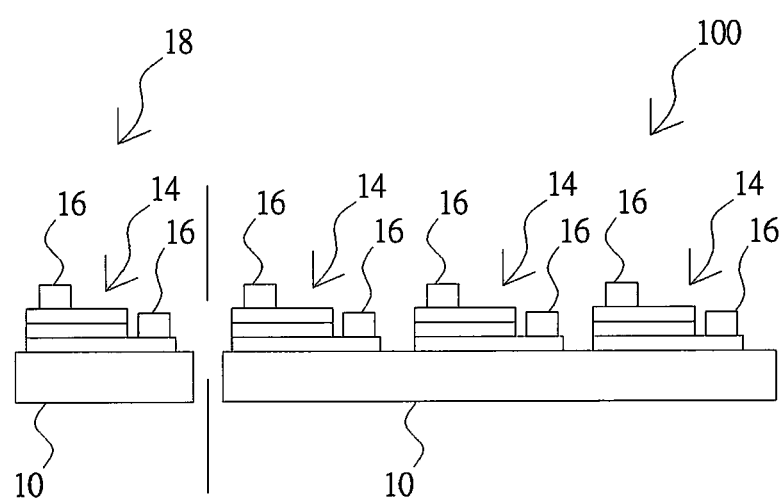
Figure 2:
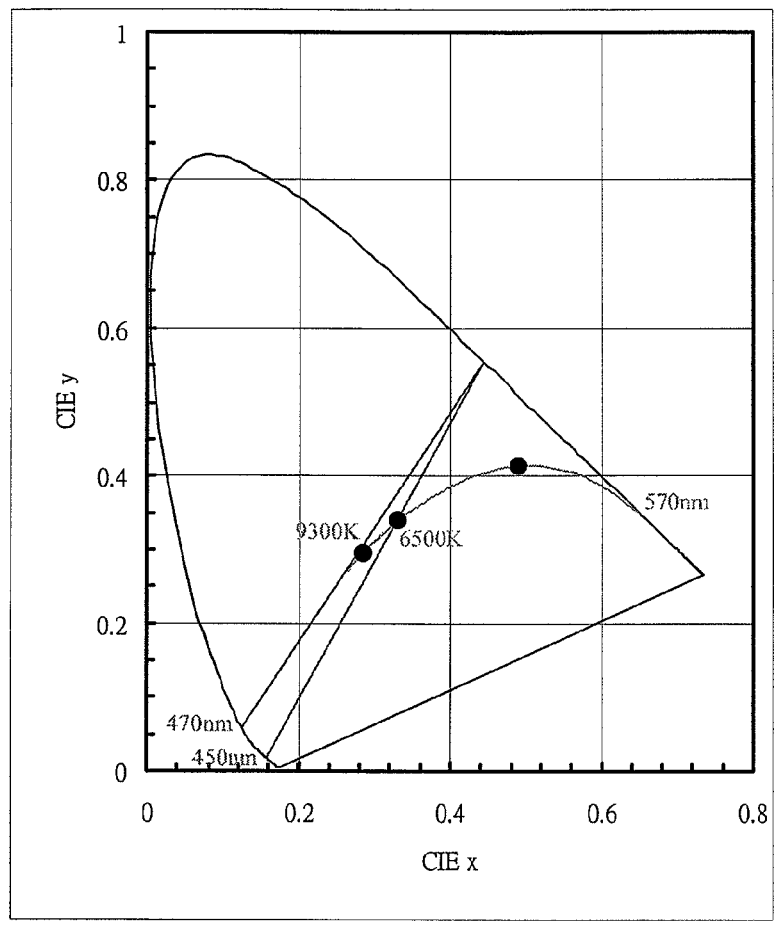
FIG. 2 illustrates a conventional CIE 1931 chromaticity diagram of a blue LED combining with yellow phosphor powders.
Figure 3:
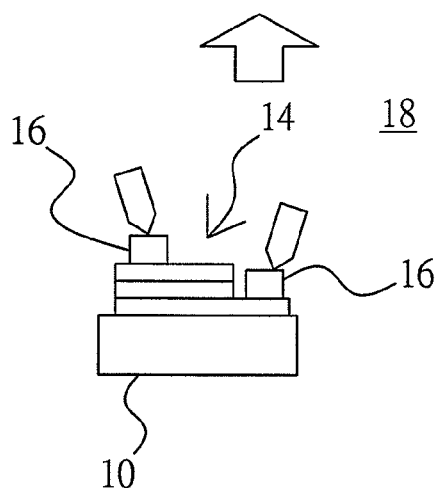
FIG. 3 illustrates a conventional schematic view of probing of the LED chips.

Reference is made in detail to the preferred embodiments of the present application, examples of which are illustrated in the accompanying drawings. Wherever possible, the same reference numbers are used in the drawings and the description to refer to the same or like parts.

Figure 4A:
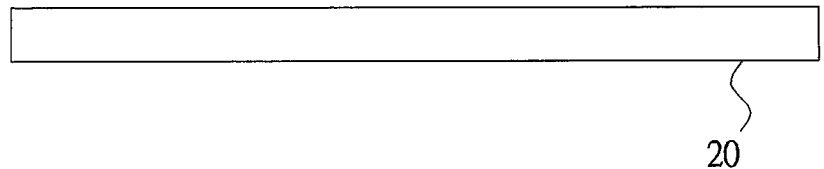
FIGS. 4A-4F illustrate a process flow of manufacturing LED chips in accordance with an embodiment of the present application.
Figure 4B:
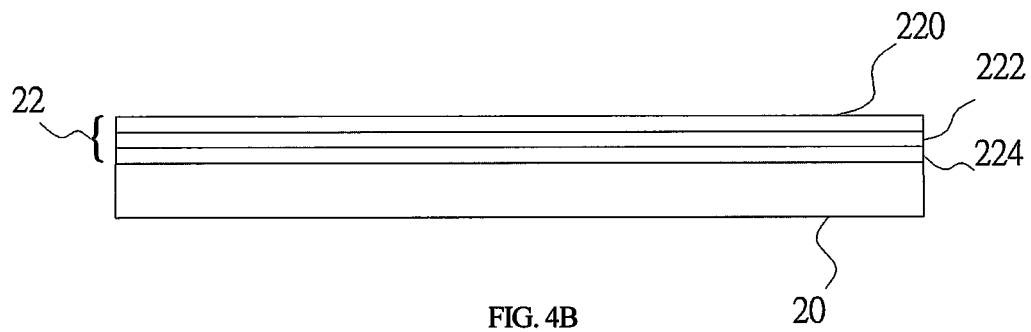

FIGS. 4A-4F illustrate a process flow in accordance with an embodiment of the present application. As FIG. 4A shows, a substrate 20 is provided, wherein the substrate 20 can be an electrical conductive substrate. As FIG. 4B shows, a plurality of epitaxial layers 22 is formed on the substrate 20, wherein each of the plurality of epitaxial layers 22 at least includes a first conductivity-type semiconductor layer 220, an active layer 222, and a second conductivity-type semiconductor layer 224. The material of the plurality of epitaxial layers 22 can be a material including at least one element of Al, Ga, In, N, P, or As, such as GaN series or AlGaInP series material, for example. The embodiment below takes GaN series material as an example for explanation.

Figure 4C:
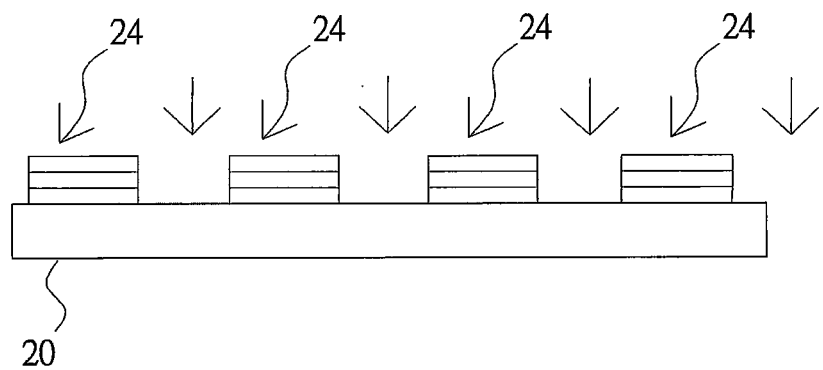
Figure 4D:
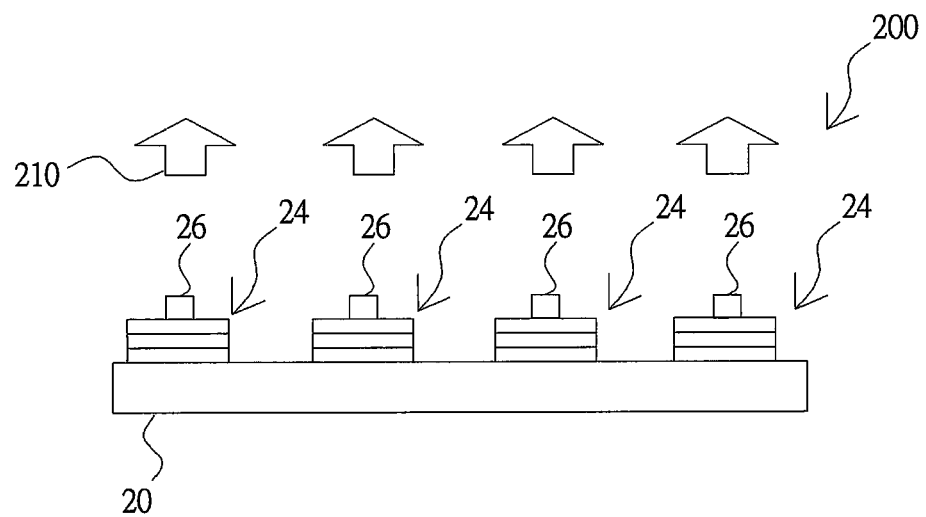

As FIG. 4C shows, a plurality of light-emitting stacked layers 24 is formed on the substrate 20 by etching the plurality of epitaxial layers 22 with lithography. As FIG. 4D shows, a plurality of electrodes 26 is formed on the plurality of light-emitting stacked layers 24 by evaporation, and an LED wafer 200 is formed.

The plurality of light-emitting stacked layers 24 can emit a plurality of first lights 210, wherein the dominant wavelengths of the first lights 210 are between 390 nm and 430 nm. There is a first difference of the dominant wavelengths between any two first lights 210, wherein the maximum of the first difference of the dominant wavelengths is a first dominant wavelength variation $V_1$.

Figure 4E:
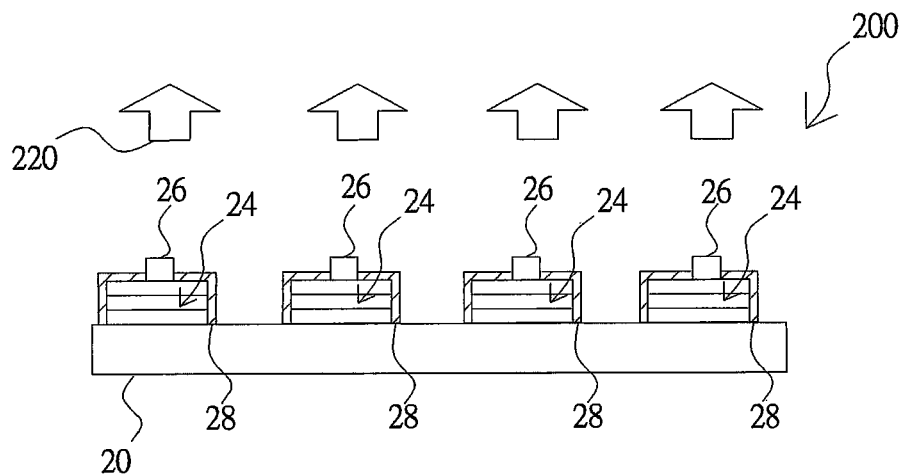

As FIG. 4E shows, after forming the electrodes 26, a plurality of wavelength transforming layers 28 is formed to cover the surfaces of the plurality of light-emitting stacked layers 24, wherein the material of the plurality of wavelength transforming layers 28 contains fluorescent material or phosphor material. In this embodiment, the plurality of wavelength transforming layers 28 can be composed of phosphor powder. The material of the wavelength transforming layer 28 can be blue phosphor powder containing one or more than one materials selected from a group consisting of $Si_3MgSi_2O_8$:Eu, $BaMgAl_{10}O_{17}$:Eu, $(SrBaCa)_5(PO_4)_3Cl$:Eu, $Sr_3(Al_2O_5)Cl_2$: $Eu^{2+}$ and $Sr_4Al_{14}O_{25}$:Eu. The phosphor powder is uniformly or partially spread on the surface of the light-emitting stacked layer 24 so the wavelength transforming layer 28 absorbs substantially the whole first light 210 emitted from the light-emitting stacked layer 24 and converts the first light 210 into a second light 220. The first light 210 is totally absorbed by the plurality of wavelength transforming layers 28 when the plurality of wavelength transforming layer is formed on the plurality of light-emitting stacked layers emitting the first light.

Figure 4F:
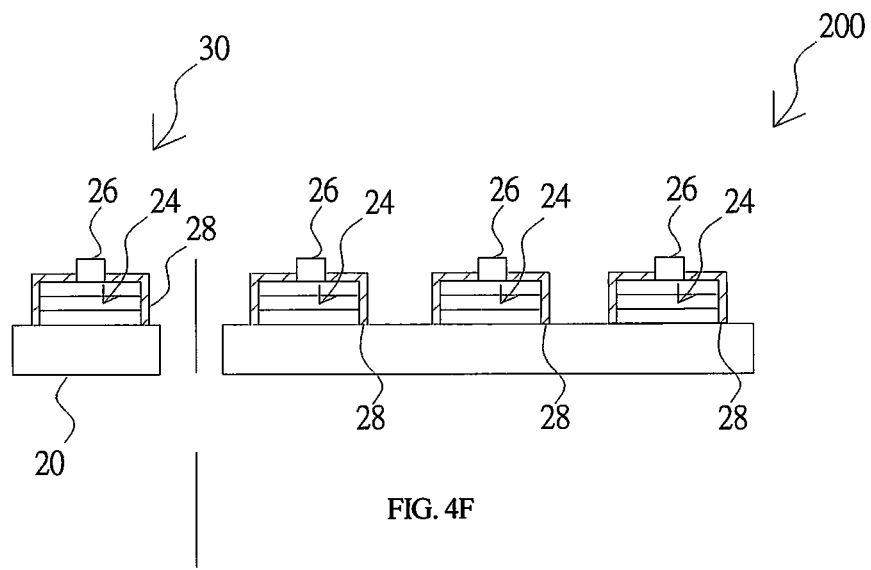

In this embodiment, the dominant wavelengths of the second lights 220 are between 450 nm and 470 nm which are blue lights of long wavelength. There is a second difference of the dominant wavelengths between any two second lights 220, wherein the maximum of the second difference of the dominant wavelengths is a second dominant wavelength variation $V_2$. Finally, as FIG. 4F shows, the plurality of light-emitting stacked layers 24 is diced to form a plurality of LED chips 30.

In the above embodiment, the first dominant wavelength variation $V_1$ is between 15 nm and 20 nm, and the second dominant wavelength variation $V_2$ is less than 10 nm, preferably less than 5 nm. The difference of the dominant wavelengths of the lights from any two of the plurality of light-emitting layers 24 can be reduced by forming the plurality of wavelength transforming layers 28 on the plurality of light-emitting stacked layers 24. The distribution of the dominant wavelengths of the plurality of LED chips 30 from the same LED wafer 200 can be convergent to improve the usage efficiency of the plurality of light-emitting stacked layers 24 on the LED wafer 200. Moreover, the above embodiment can skip sorting and binning processes in the manufacturing process of the LED chips to further reduce the cost of production.

Figure 5:
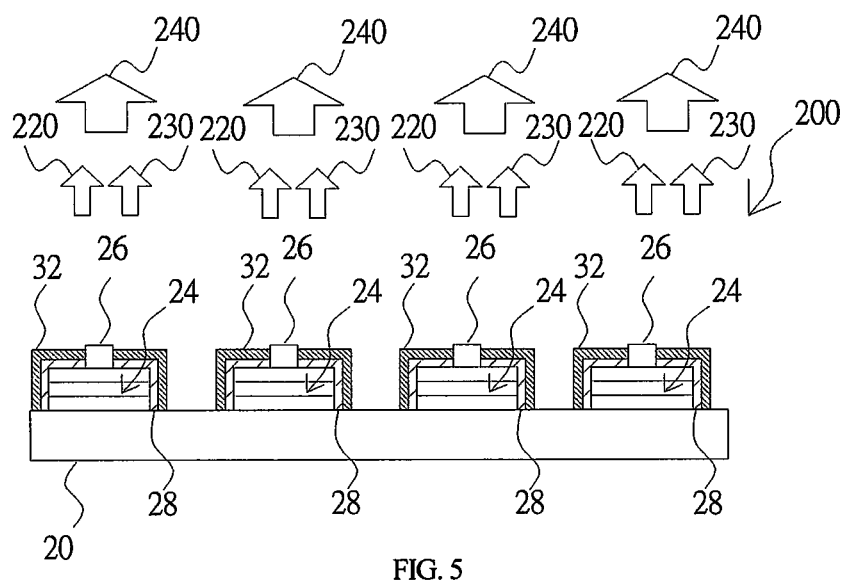
FIG. 5 illustrates a cross-sectional view of the LED chips in accordance with another embodiment of the present application.

In addition, as FIG. 5 shows, the present application can include the step of forming a wavelength converting layer 32 on the wavelength transforming layer 28 after forming the wavelength transforming layer 28. The wavelength converting layer 32 includes one or more than one kind of phosphor powders, wherein the phosphor powders include a material selected from a group consisting of yellow phosphor powders including yttrium aluminum garnet (YAG) or alkaline-earth halide aluminate, green phosphor powders including $BaMgAl_{10}O_{17}$:Eu, $MnBa_2SiO_4$:Eu, $(Sr,Ca)SiO_4$:Eu, $CaSc_2O_4$:Eu, $Ca_8Mg(SiO_4)_4Cl_2$:Eu, Mn, $SrSi_2O_2N_2$:Eu, $LaPO_4$:Tb,Ce, $Zn2SiO_4$:Mn, ZnS:Cu, $YBO_3$:Ce,Tb, $(Ca,Sr,Ba)Al_2O_4$:Eu, $Sr_2P_2O_7$:Eu,Mn, $SrAl_2S_4$:Eu, $BaAl_2S_4$:Eu, $Sr_2Ga_2S_5$:Eu, SiAlON:Eu, $KSrPO_4$:Tb, or $Na_2Gd_2B_2O_7$:Ce, Tb, and red phosphor powders including $Y_2O_3$:Eu, $YVO_4$:Eu, CaSiAlN3:Eu, $(Sr,Ca)SiAlN3$:Eu, $Sr_2Si_5N_8$:Eu, $CaSiN_2$:Eu, $(Y,Gd)BO_3$:Eu, $(La,Y)_2O_2S$:Eu, $La_2TeO_6$:Eu, SrS:Eu, $Gd_2MoO_6$:Eu, $Y_2WO_6$:Eu,Bi, $Lu_2WO_6$:Eu,Bi, $(Ca,Sr,Ba)MgSi_2O_6$:Eu,Mn, $Sr_3SiO_5$:Eu, $SrY_2S_4$:Eu, $CaSiO_3$:Eu, $Ca_8MgLa(PO_4)_7$:Eu, $Ca_8MgGd(PO_4)_7$:Eu, $Ca_8MgY(PO_4)_7$:Eu, or $CaLa_2S_4$:Ce. The above phosphor powders are uniformly or partially spread on the wavelength transforming layer 28.

In this embodiment, the wavelength converting layer 32 includes at least one yellow phosphor powder. The wavelength converting layer 32 can absorb the second light 220 and convert the second light 220 into third light 230 in yellow color, wherein the dominant wavelength of the third light 230 is about 570 nm. Then, the third light 230 of yellow color and the second light 220 which is not absorbed by the wavelength converting layer 32 are mixed to generate a fourth light 240 in white light.

Figure 6:
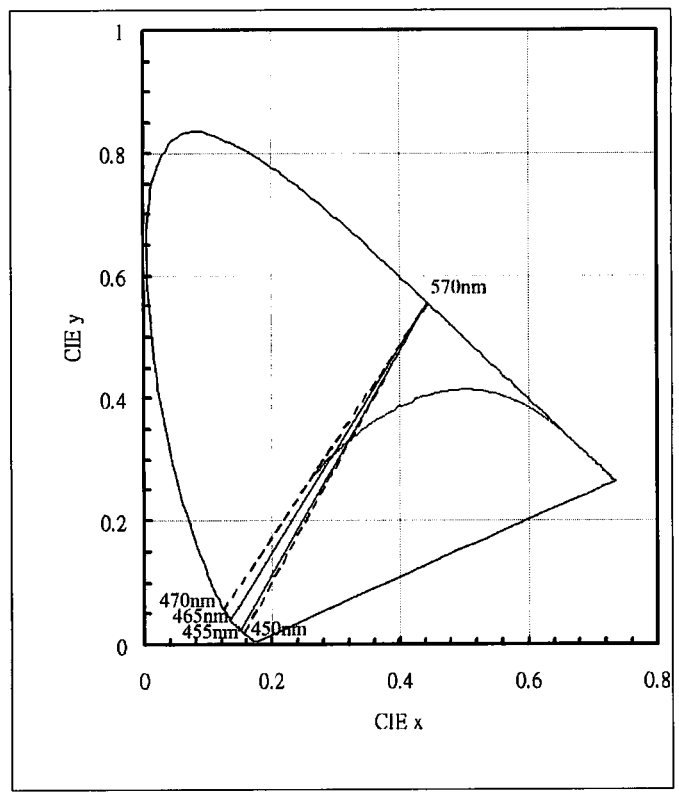
FIG. 6 illustrates a CIE 1931 chromaticity diagram in accordance with the embodiment of the present application.

Because the dominant wavelength of the second light 220 is about 460 nm and the second dominant wavelength variation $V_2$ is less than 10 nm, preferably less than 5 nm. In the embodiment, the distribution range of the second dominant wavelengths is between 455 nm and 465 nm. FIG. 6 illustrates a CIE 1931 chromaticity diagram of the fourth light 240. As FIG. 6 shows, the color temperature of the fourth light 240 which is generated by mixing the second light 220 and the third light 230 is about between 6500K and 8500K (the intersection point of the black curve and the solid line in FIG. 6). The difference of the color temperature of the fourth light 240 is less than 2000K, preferably less than 1000K.

Comparing to the conventional technology that the blue LED whose dominant wavelength is between 450 nm and 470 nm combines with the yellow phosphor powder to generate the white light of which the difference of the color temperature is 3000K (the intersection point of the black curve and the dotted line in FIG. 6), the embodiment of the present application significantly increases the uniformity of the light emitted from each light-emitting stacked layer of an LED wafer.

Figure 7:
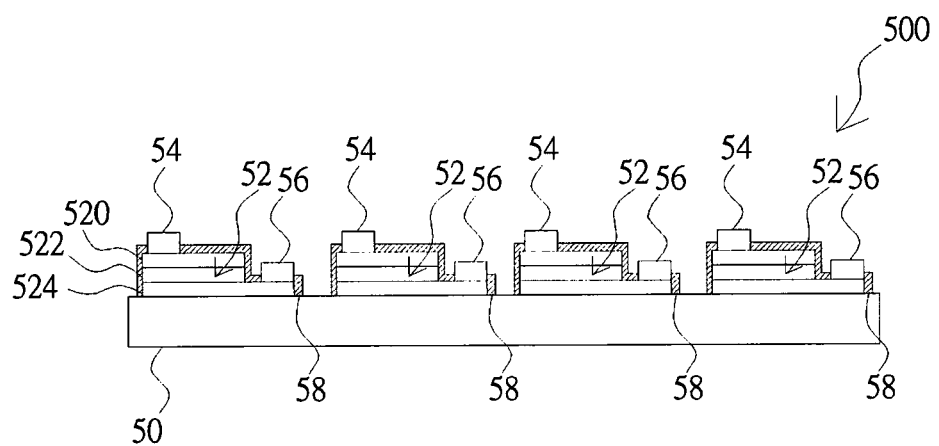
FIG. 7 illustrates a cross-sectional view of the LED chips in accordance with another embodiment of the present application.

Furthermore, although the LED chip which is a vertical structure is taken as an example in the above embodiment, the scope of the present application is not limited to the LED of the vertical structure. FIG. 7 is a cross-sectional view of another embodiment of the present application. As FIG. 7 shows, an LED wafer 500 includes a substrate 50, and a plurality of light-emitting stacked layers 52, a plurality of first electrodes 54, a plurality of second electrodes 56, and a plurality of wavelength transforming layers 58 formed on the substrate 50, wherein each of the plurality of light-emitting stacked layers 52 at least includes a first conductivity-type semiconductor layer 520, an active layer 522, and a second conductivity-type semiconductor layer 524. Each of the plurality of light-emitting stacked layers 52 includes a plane exposing the second conductivity-type semiconductor layer 524. Each of the plurality of first electrodes 54 and each of the plurality of second electrodes 56 are located on the first conductivity-type semiconductor layer 520 and the second conductivity-type semiconductor layer 524 respectively. The plurality of wavelength transforming layers 58 covers the plurality of light-emitting stacked layers 52.

Figure 8A:
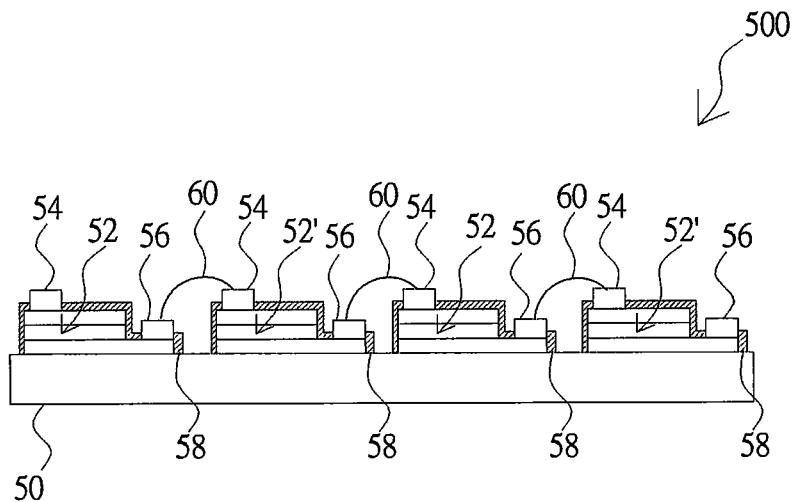
FIGS. 8A-8B illustrate cross-sectional views of the LED chips in accordance with other embodiments of the present application.
Figure 8B:
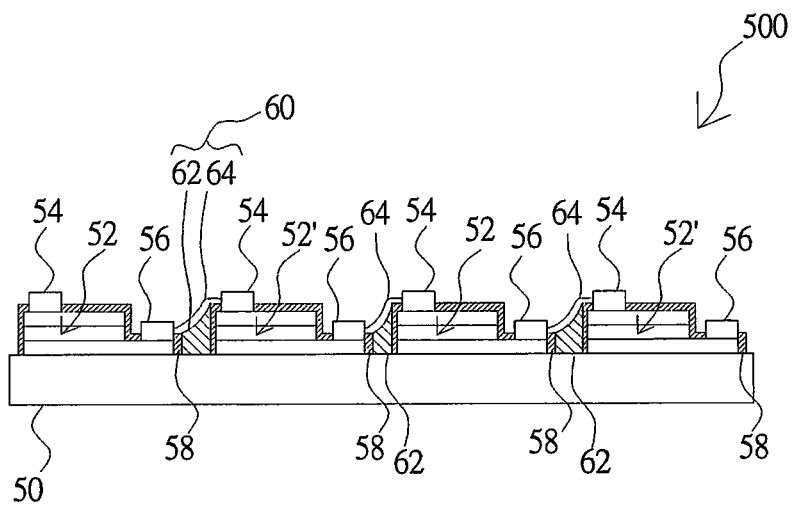

Moreover, FIGS. 8A and 8B are cross-sectional views of other embodiments of the present application. The embodiments can further include an electrical connection structure 60 to connect the adjacent light-emitting stacked layers 52/52' in series connection. As FIG. 8A shows, the electrical connection structure 60 is a metal wire. The wire bonding technology is utilized to electrically connect the second electrode 56 of a light-emitting stacked layer 52 and the first electrode 54 of another light-emitting stacked layer 52' to form a series connection between different light-emitting stacked layers 52 and 52'. As FIG. 8B shows, the electrical connection structure 60 can also include an insulating layer 62 formed between the adjacent light-emitting stacked layers 52 and 52', and a metal layer 64 formed on the insulating layer 62 to electrically connect the second electrode 56 of a light-emitting stacked layer 52 and the first electrode 54 of another light-emitting stacked layer 52'. Thus, there is a series connection between different light-emitting stacked layers 52 and 52'.

Figure 9:
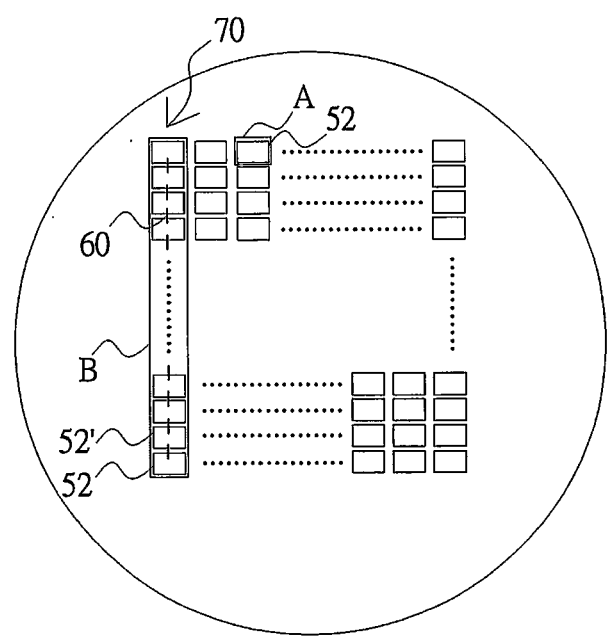
FIG. 9 illustrates a schematic view of dicing steps in accordance with another embodiment of the present application.

Additionally, as FIG. 9 shows, each of the plurality of light-emitting stacked layers 52 can be diced along the dicing line A to form the LED chip in the step of dicing the LED wafer. The plurality of light-emitting stacked layers 52 and 52' which are connected by the electrical connection structure 60 in series connection are diced along the dicing line B to form an LED array chip 70. In general, the voltage drop of each of the plurality of light-emitting stacked layer 52 and 52' is about 3.5V. Fourteen light-emitting stacked layers 52 and 52' which are in series connection are diced to form an LED array chip 70 and can be directly applied to the vehicle application which is 48V in the alternating current power supply. Moreover, thirty light-emitting stacked layers 52 and 52' connected in series can also be diced to form the LED array chip 70 and can be directly applied to the household application with 100V in the alternating current power supply. Because there is a wavelength transforming layer on each of the light-emitting stacked layers 52 and 52', the dominant wavelengths of each of the light-emitting stacked layers 52 and 52' are more consistent. Thus, the process of sorting and binning based on the distribution of the dominant wavelengths can be eliminated in the conventional manufacturing process of the LED array chip to reduce the cost of production.

The foregoing description has been directed to the specific embodiments of this application. It will be apparent, however, that other variations and modifications may be made to the embodiments without escaping the spirit and scope of the application.

What is claimed is:

1. A method of manufacturing a light-emitting device with narrow dominant wavelength distribution, comprising the steps of:
   providing a substrate;
   forming a plurality of light-emitting stacked layers on the substrate, wherein each of the plurality of light-emitting stacked layers emits a first light, and the first lights emitted by the plurality of light-emitting stacked layers have a first dominant wavelength variation; and
   forming a plurality of wavelength transforming layers on the plurality of light-emitting stacked layers, wherein each of the plurality of wavelength transforming layers absorbs the first light and emits a second light, and the second lights emitted by the plurality of wavelength transforming layers having a second dominant wavelength variation smaller than the first dominant wavelength variation.

2. The method of claim 1, wherein the material of the plurality of light-emitting stacked layers comprise a material containing at least one element selected from a group consisting of Al, Ga, In, N, P, and As.

3. The method of claim 1, wherein the dominant wavelengths of the first lights emitted by the plurality of light-emitting stacked layers are between 390 nm and 430 nm.

4. The method of claim 1, wherein the first lights emitted by the plurality of light-emitting stacked layers are totally absorbed by the plurality of wavelength transforming layers when the plurality of wavelength transforming layers is formed on the plurality of light-emitting stacked layers emitting the first lights.

5. The method of claim 1, wherein each of the plurality of wavelength transforming layers at least comprises a phosphor powder or a fluorescent powder, wherein the phosphor powder comprises a material selected from a group consisting of $Si_3MgSi_2O_8$:Eu, $BaMgAl_{10}O_{17}$:Eu, $(SrBaCa)_5(PO_4)_3Cl$:Eu, $Sr_3(Al_2O_5)Cl_2$:Eu$^{2+}$, and $Sr_4Al_{14}O_{25}$:Eu.

6. The method of claim 1, further comprising forming a plurality of wavelength converting layers on the plurality of wavelength transforming layers, the plurality of wavelength converting layers absorbing a portion of the second light and emitting a third light, wherein the second light and the third light are mixed to generate a fourth light.

7. The method of claim 6, wherein the plurality of wavelength converting layers at least comprises a material selected from a group consisting of yellow phosphor powders comprising yttrium aluminum garnet (YAG) or alkaline-earth halide aluminate, green phosphor powders comprising $BaMgAl_{10}O_{17}$:Eu, $MnBa_2SiO_4$:Eu, $(Sr,Ca)SiO_4$:Eu, $CaSc_2O_4$:Eu, $Ca_8Mg(SiO_4)_4Cl_2$:Eu, Mn, $SrSi_2O_2N_2$:Eu, LaPO$_4$:Tb, Ce, Zn2SiO$_4$:Mn, ZnS:Cu, YBO$_3$:Ce,Tb, (Ca,Sr,Ba)Al$_2$O$_4$:Eu, Sr$_2$P$_2$O$_7$:Eu,Mn, SrAl$_2$S$_4$:Eu, BaAl$_2$S$_4$:Eu, Sr$_2$Ga$_2$S$_5$:Eu, SiAlON:Eu, KSrPO$_4$:Tb, or Na$_2$Gd$_2$B$_2$O$_7$:Ce, Tb, and red phosphor powders comprising Y$_2$O$_3$:Eu, YVO$_4$:Eu, CaSiAlN3:Eu, (Sr, Ca)SiAlN3:Eu, Sr$_2$Si$_5$N$_8$:Eu, CaSiN$_2$:Eu, (Y,Gd)BO$_3$: Eu, (La,Y)$_2$O$_2$S:Eu, La$_2$TeO$_6$:Eu, SrS:Eu, Gd$_2$MoO$_6$:Eu, Y$_2$WO$_6$:Eu,Bi, Lu$_2$WO$_6$:Eu,Bi, (Ca, Sr, Ba)MgSi$_2$O$_6$:Eu,Mn, Sr$_3$SiO$_5$:Eu, SrY$_2$S$_4$:Eu, CaSiO$_3$:Eu, Ca$_8$MgLa(PO$_4$)$_7$:Eu, Ca$_8$MgGd(PO$_4$)$_7$:Eu, Ca$_8$MgY(PO$_4$)$_7$:Eu, or CaLa$_2$S$_4$:Ce.

8. The method of claim 6, wherein the color temperature distribution of the fourth light is less than 2000K.

9. The method of claim 1, further comprising:
   forming a plurality of electrodes on the plurality of light-emitting stacked layers; and
   forming an electrical connection structure among the plurality of electrodes to form series connection among the plurality of light-emitting stacked layers.

10. The method of claim 9, wherein the electrical connection structure is a metal wire.

11. The method of claim 9, wherein the electrical connection structure comprises:
    a plurality of insulating layers formed among the plurality of light-emitting stacked layers; and
    metal layers electrically connecting the plurality of electrodes, formed on the plurality of insulating layers.

12. The method of claim 1, further comprising dicing the substrate.

13. A light-emitting device with narrow dominant wavelength distribution, comprising:
    a substrate;
    a plurality of light-emitting stacked layers on the substrate, wherein each of the plurality of light-emitting stacked layers emits a first light having a first dominant wavelength variation;
    a plurality of electrodes formed on the plurality of light-emitting stacked layers and electrically connecting therewith; and
    a plurality of wavelength transforming layers covering the plurality of light-emitting stacked layers, each of the plurality of wavelength transforming layers absorbing the first light and emitting a second light having a second dominant wavelength variation, wherein the first dominant wavelength variation is larger than the second dominant wavelength variation.

14. The light-emitting device of claim 13, wherein the first light is totally absorbed by the plurality of wavelength transforming layers when the plurality of wavelength transforming layer is formed on the plurality of light-emitting stacked layers emitting the first light.

15. The light-emitting device of claim 13, wherein the dominant wavelength of the first light is between 390 nm and 430 nm.

16. The light-emitting device of claim 13, wherein each of the plurality of wavelength transforming layers at least comprises a phosphor powder or a fluorescent powder, wherein the phosphor powder comprises a material selected from a group consisting of Si$_3$MgSi$_2$O$_8$:Eu, BaMgAl$_{10}$O$_{17}$:Eu, (Sr-BaCa)$_5$(PO$_4$)$_3$Cl:Eu, Sr$_3$(Al$_2$O$_5$)Cl$_2$:Eu$^{2+}$, and Sr$_4$Al$_{14}$O$_{25}$:Eu.

17. The light-emitting device of claim 13, wherein the plurality of light-emitting stacked layers comprise a material containing at least one element selected from a group consisting of Al, Ga, In, N, P, and As.

18. The light-emitting device of claim 13, further comprising a plurality of wavelength converting layers on the plurality of wavelength transforming layers, the plurality of wavelength-converting layers absorbing a portion of the second light and emitting a third light, wherein the second light and the third light are mixed to generate a fourth light.

19. The light-emitting device of claim 18, wherein the color temperature distribution of the fourth light is less than 2000K.

20. The light-emitting device of claim 18, wherein each of the plurality of wavelength-converting layers at least comprises a material selected from a group consisting of yellow phosphor powders comprising yttrium aluminum garnet (YAG) or alkaline-earth halide aluminate, green phosphor powders comprising BaMgAl$_{10}$O$_{17}$:Eu, MnBa$_2$SiO$_4$:Eu, (Sr, Ca)SiO$_4$:Eu, CaSc$_2$O$_4$:Eu, Ca$_8$Mg(SiO$_4$)$_4$Cl$_2$:Eu, Mn, SrSi$_2$O$_2$N$_2$:Eu, LaPO$_4$:Tb, Ce, Zn2SiO$_4$:Mn, ZnS:Cu, YBO$_3$:Ce,Tb, (Ca,Sr,Ba)Al$_2$O$_4$:Eu, Sr$_2$P$_2$O$_7$:Eu,Mn, SrAl$_2$S$_4$:Eu, BaAl$_2$S$_4$:Eu, Sr$_2$Ga$_2$S$_5$:Eu, SiAlON:Eu, KSrPO$_4$:Tb, or Na$_2$Gd$_2$B$_2$O$_7$:Ce,Tb, and red phosphor powders comprising Y$_2$O$_3$:Eu, YVO$_4$:Eu, CaSiAlN3:Eu, (Sr, Ca)SiAlN3:Eu, Sr$_2$Si$_5$N$_8$:Eu, CaSiN$_2$:Eu, (Y,Gd)BO$_3$:Eu, (La,Y)$_2$O$_2$S:Eu, La$_2$TeO$_6$:Eu, SrS:Eu, Gd$_2$MoO$_6$:Eu, Y$_2$WO$_6$:Eu,Bi, Lu$_2$WO$_6$:Eu,Bi, (Ca,Sr, Ba)MgSi$_2$O$_6$:Eu,Mn, Sr$_3$SiO$_5$:Eu, SrY$_2$S$_4$:Eu, CaSiO$_3$:Eu, Ca$_8$MgLa(PO$_4$)$_7$:Eu, Ca$_8$MgGd(PO$_4$)$_7$:Eu, Ca$_8$MgY(PO$_4$)$_7$:Eu, or CaLa$_2$S$_4$:Ce.

21. The light-emitting device of claim 13, further comprising a plurality of electrical connection structures, the plurality of electrical connection structures electrically connecting the plurality of electrodes to form a series connection among the plurality of light-emitting stacked layers.

22. The light-emitting device of claim 21, wherein each of the plurality of electrical connection structures is a metal wire.

23. The light-emitting device of claim 21, wherein each of the plurality of electrical connection structures comprises:
    a plurality of insulating layers among the plurality of light-emitting stacked layers; and
    a metal layers electrically connecting the plurality of electrodes, formed on the plurality of insulating layers.

* * * * *